US007377792B2

(12) United States Patent
Ma

(10) Patent No.: US 7,377,792 B2

(45) Date of Patent: May 27, 2008

(54) LGA SOCKET CONNECTOR HAVING HOUSING WITH UPWARD PROTECTIVE PROTRUSION ADJACENT CONTACT TERMINAL

(75) Inventor: Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/784,834

(22) Filed: Apr. 10, 2007

(65) Prior Publication Data

US 2007/0238345 A1 Oct. 11, 2007

(30) Foreign Application Priority Data

Apr. 10, 2006 (TW) .............................. 95205949 U

(51) Int. Cl.
*H01R 12/00* (2006.01)
*H05K 1/00* (2006.01)

(52) U.S. Cl. ........................................ 439/71; 439/948

(58) Field of Classification Search .................. 439/71, 439/948

See application file for complete search history.

(56) References Cited

U.S. PATENT DOCUMENTS 4,505,105 A * 3/1985 Ness ......................... 60/200.1
4,621,884 A * 11/1986 Berkebile et al. ........... 439/367
4,692,790 A * 9/1987 Oyamada ..................... 257/727
5,302,853 A * 4/1994 Volz et al. .................. 257/707
5,344,334 A * 9/1994 Laub et al. ................. 439/331

* cited by examiner

*Primary Examiner*—Javaid H. Nasri
(74) *Attorney, Agent, or Firm*—Wei Te Chung

(57) ABSTRACT

An electrical connector comprising an insulative housing defining a mating surface adapted to support an IC package, at least four passageways defined in region within the mating surface and each passageway associated a clapboard arranged between every two adjacent passageways; at least four contacts received in corresponding passageways respectively, each contact including a contact engaging portion extending upwardly above the mating surface and toward the IC; wherein the clapboard has protrusions extending upwardly therefrom along a direction perpendicular to a bottom surface of the IC package seated on the mating surface, the protrusions comprising first protrusions and second protrusions higher than the first protrusions; the first protrusions being arranged between every two adjacent contacts, allowing the engaging portion of the two adjacent contacts without interference when the IC is seated on the mating surface of the housing.

9 Claims, 6 Drawing Sheets

LGA SOCKET CONNECTOR HAVING HOUSING WITH UPWARD PROTECTIVE PROTRUSION ADJACENT CONTACT TERMINAL

BACKGROUND OF THE INVENTION

1. Field of the Invention

The present invention relates to an electrical connector, and more particularly to an electrical connector for electrically connecting an IC packaged and a printed circuit board (PCB).

2. Background of the invention

Land Grid Array (LGA) electrical connectors are widely used for electrically connecting two electrical interfaces such as an electrical substrate, e.g. a PCB, and an integrated circuit (IC) package, e.g. a central processing unit (CPU).

Typical conventional LGA connectors are disclosed in U.S. Pat. Nos. 4,504,105, 4,621,884, 4,692,790, 5,302,853, and 5,344,334. Each of these connectors generally comprises an insulative housing embedded with a plurality of electrical contact.

FIG. 1 disclosed an electrical connector 6 relates to the present invention, comprising an insulative housing 60 that is generally of a rectangle shape and a number of electrical contacts 61. Each of the electrical contacts 61 connects a contact carrier 610. The insulative housing 60 has two first sidewalls 62 opposite to each other and two second sidewalls 63 opposite to each other and adjacent to the first sidewalls 62. Said four sidewalls define a receiving cavity for receiving an IC package (not shown), and the insulative housing 60 defining a mating surface 64 adapted to support an IC package, a number of passageways 65 defined in the region with the mating surface 64. The insulative housing 60 defines a plurality of protrusions 640 seated around the mating surface 64. The two first sidewalls 62 each defines an incline plane (not labeled)) having a certain angle with regard to the mating surface 64. After the electrical contacts 61 be inserted into the passageways 65, the contact carrier 610 can be moved out of the insulative housing 60 along the incline plane.

Generally, as electronic systems that have said electrical connector 6 become more sophisticated, the systems require an increasing number of electrical contacts, so density of the contact is increased. When the electrical contacts 61 contacts with the IC package under an external force, two adjacent electrical contacts may interfere with each other because the contact of an LGA connector each have a resilient arm extending upwardly toward the IC package. Additionally, the protrusions 640 seated around the mating surface 64 are used to reduce or cancel said external force, the middle of the IC package may curved toward the mating surface 64 and the contacts 61 under the external force. As the external force big enough, the IC package and the electrical contacts may be destroyed and the electrical connection becomes unsteady.

Therefore, a new electrical connector to resolve the above-mentioned problems is desired.

SUMMARY OF THE INVENTION

Accordingly, an object of the present invention is to provide an electrical connector for establishing a steady electrical connection between an IC package and a PCB.

Another object of the present invention is to provide an electrical connector that can avoid the IC package and the contacts being damaged while the IC package mates with the contact.

To achieve above-mentioned object, an electrical connector according to a preferred embodiment of the present invention is provided. The electrical connector comprises an insulative housing defining a mating surface adapted to support an IC package, at least four passageways defined in region within the mating surface and each passageway associated a clapboard arranged between every two adjacent passageways; at least four contacts received in corresponding passageways respectively, each contact including a contact engaging portion extending upwardly above the mating surface and toward the IC; wherein the clapboard has protrusions extending upwardly therefrom along a direction perpendicular to a bottom surface of the IC package seated on the mating surface, the protrusions comprising first protrusions and second protrusions higher than the first protrusions; the first protrusions being arranged between every two adjacent contacts, allowing the engaging portion of the two adjacent contacts without interference when the IC is seated on the mating surface of the housing; the second protrusions being used to reduce or cancel an external force that ensures the IC seated on the mating surface.

DETAILED DESCRIPTION OF THE PREFERRED EMBODIMENT OF THE INVENTION

Figure 1:
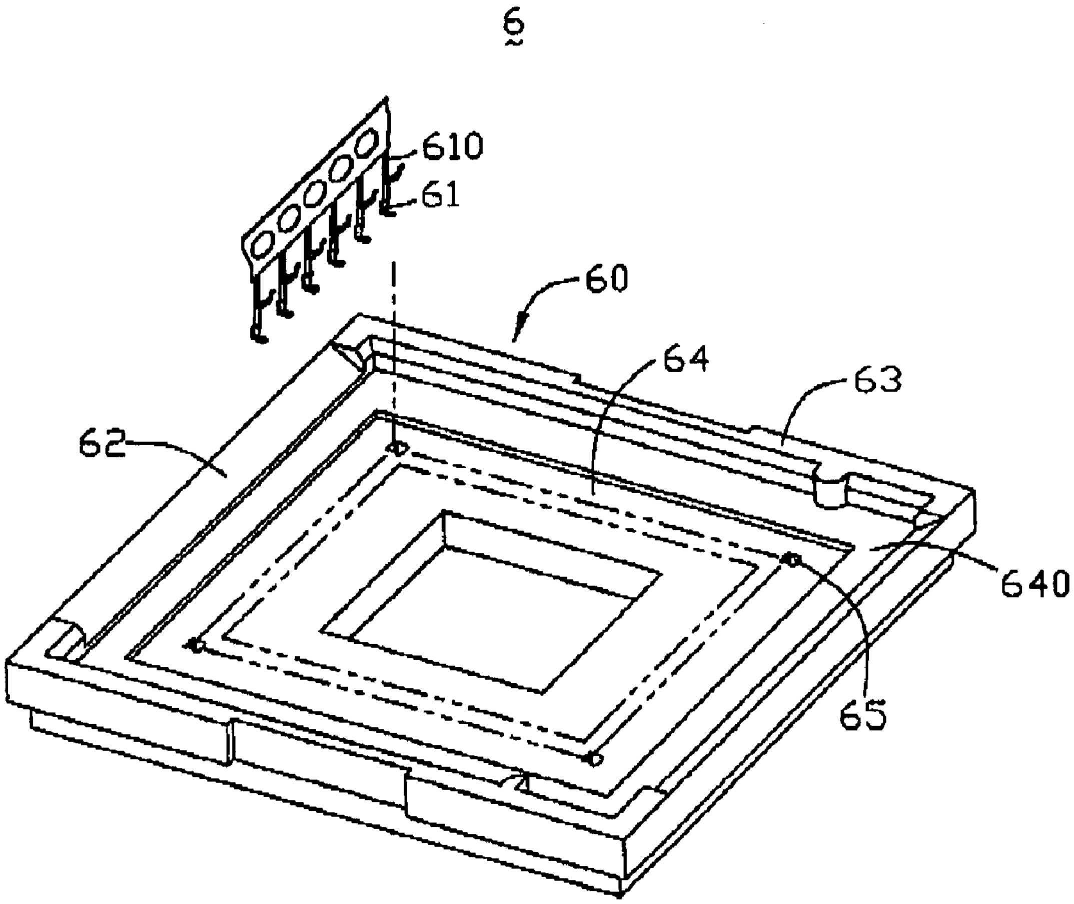
FIG. 1 (PRIOR ART)
FIG. 1 is an exploded isometric view of an electrical connector of a prior art relating to the present invention.
Figure 2:
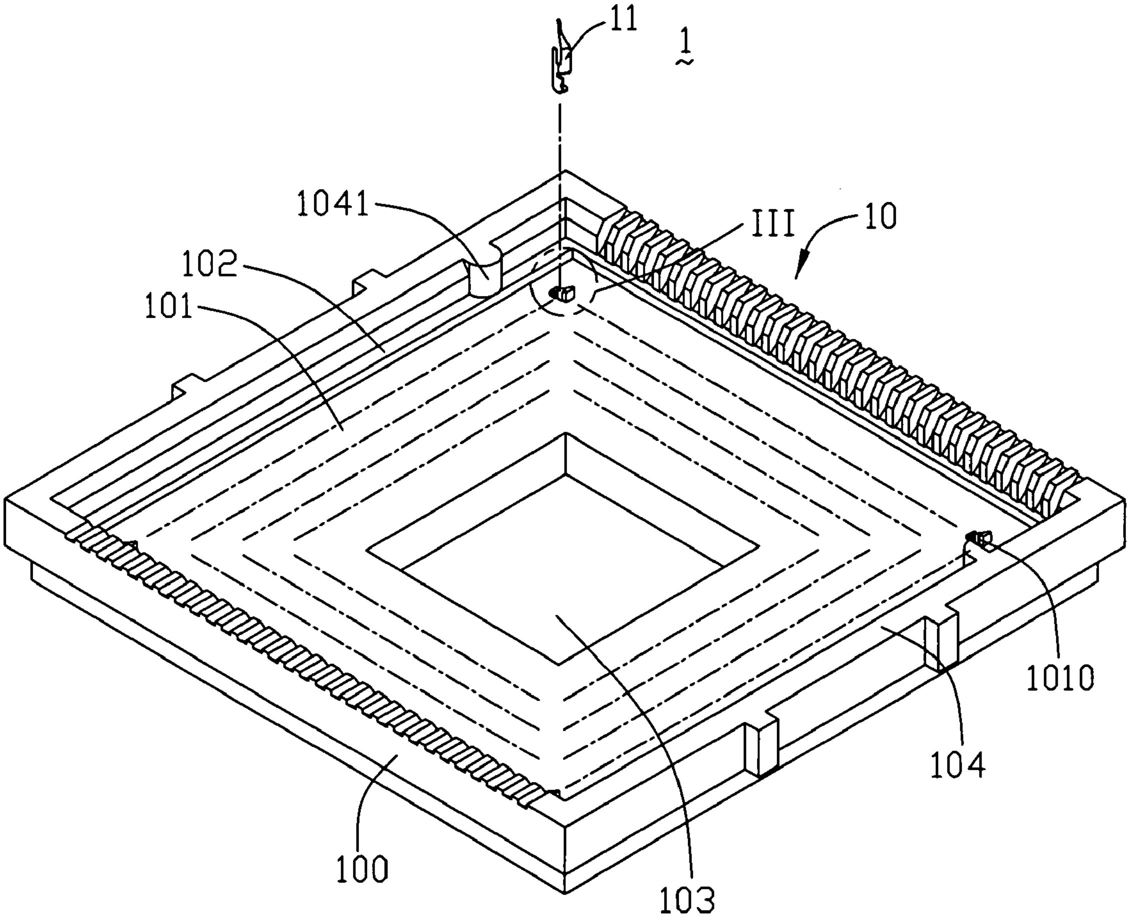
FIG. 2 is an exploded isometric view of an electrical connector of a preferred embodiment in accordance with the present invention.
Figure 3:
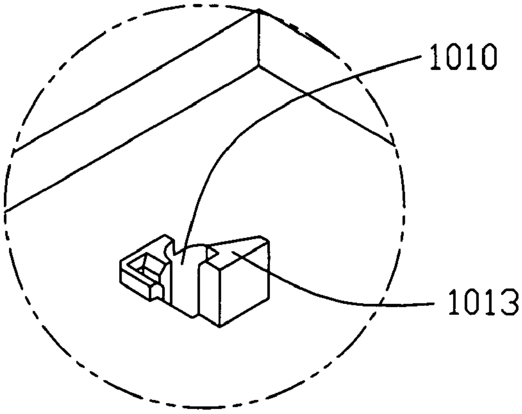
FIG. 3 is an enlarged view of the circled portion III of the FIG. 2.
Figure 4:
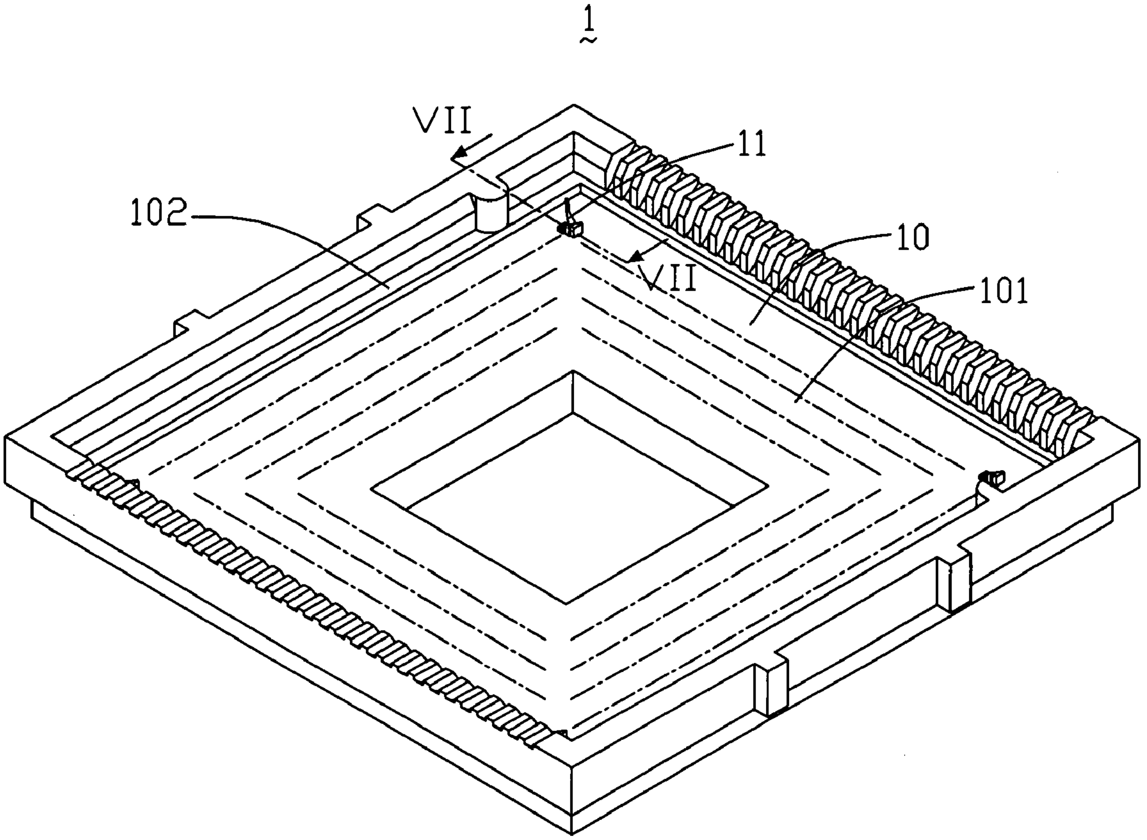
FIG. 4 is an assembly view of the electrical connector of the present invention.
Figure 5:
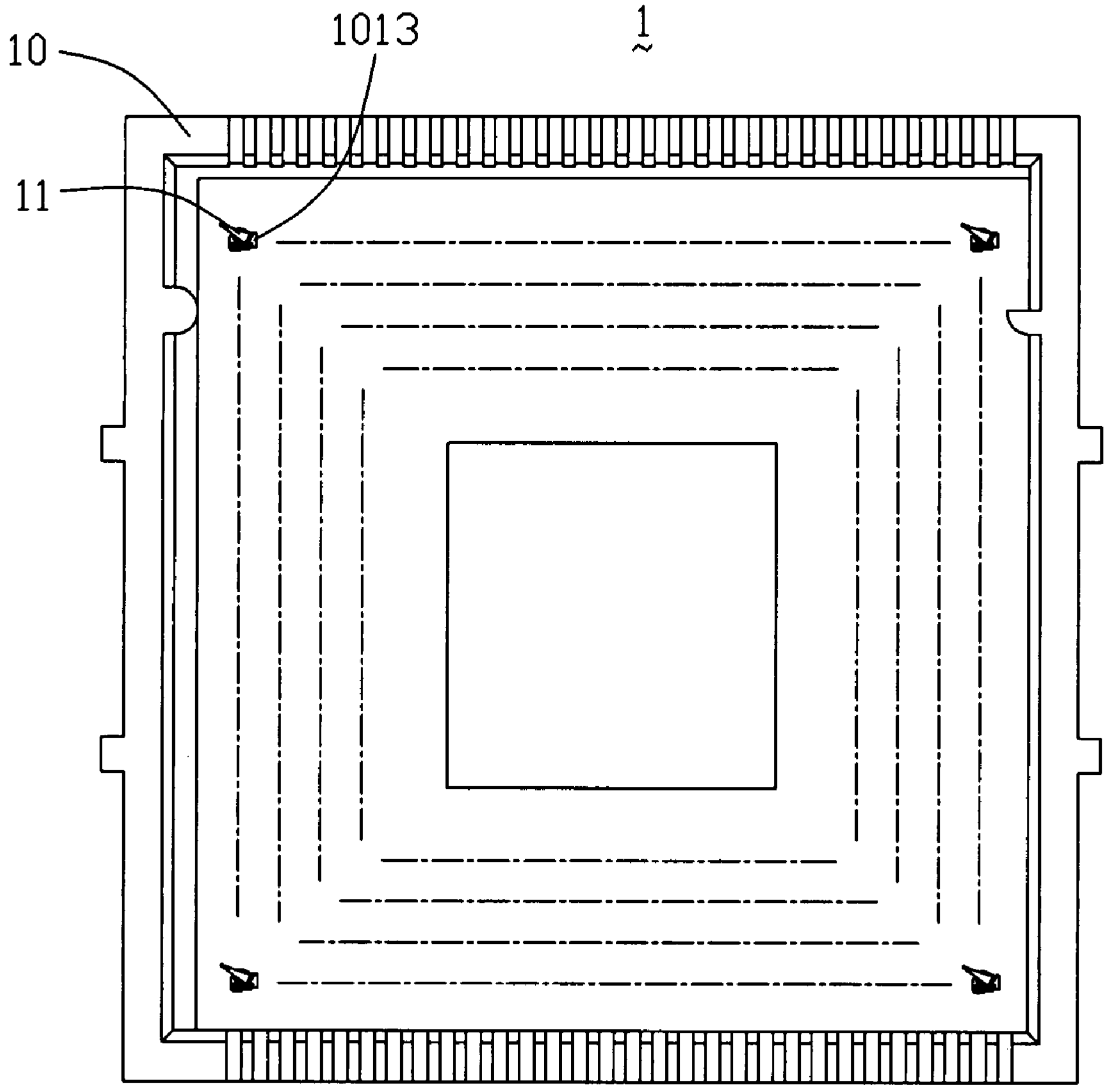
FIG. 5 is an plane view of an electrical connector of FIG. 4.
Figure 6:
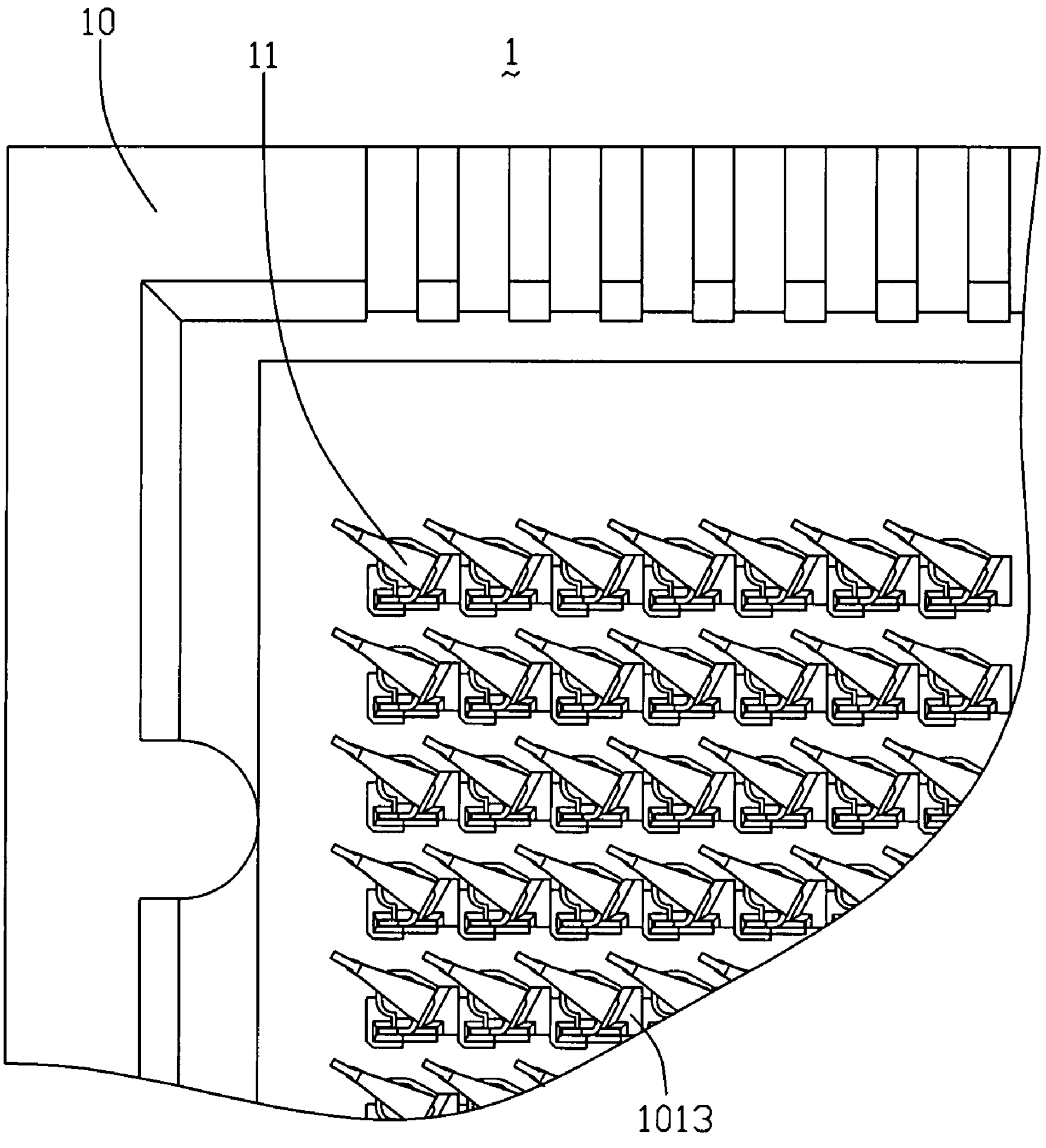
FIG. 6 is an enlarge view of a part of the electrical connector of FIG. 5.

A preferred embodiment of the present invention will be described hereunder with reference to the accompanying drawings.

Referring to FIGS. 2-8, an LGA (Land Grid Array) electrical connector 1 of a preferred embodiment in accordance with the present invention is shown. The electrical connector is adapted to electrically connect two interfaces, such as an IC and a PCB, but not limited thereto. The electrical connector 1 mainly comprises an insulative housing 10 embedded with at least four electrical contacts 11 and defined a mating surface 101 adapted to support an IC 2. The insulative housing defines two opposite first sidewalls 100 and two opposite second sidewalls 104 adjacent to the first sidewalls 100, extending upwardly and seated around the mating surface 101. Said four sidewalls define a receiving cavity for receiving the IC 2. At least four passageways 1010 is defined in region with the mating surface 101 for receiving said at least four electrical contacts 11. A number of standoffs 102 is located between the mating surface 101 and said four sidewalls, seated around the mating surface 101 and extending upwardly above the mating surface 101. Each of the electrical passageways 1010 is associated a clapboard 1011 arranged between every two adjacent passageways 1010. The clapboard 1011 has protrusions 1013 extending upwardly therefrom along a direction perpendicular to a bottom surface of the IC package 2 seated on the mating surface 101, the cross section of the protrusions 1013 be of a triangle shape. The protrusions 1013 comprise first protrusions 1014 and second protrusions 1015 higher than the first protrusion 1014. Additionally, the second protrusion 1015 has a same height equal to the standoffs 102. The second protrusions 1015 and said standoffs are used to prop the IC 2 and reduce or cancel an external force, when the IC 2 is seated on the mating surface 101 and connects with the electrical contacts 11.

Figure 7:
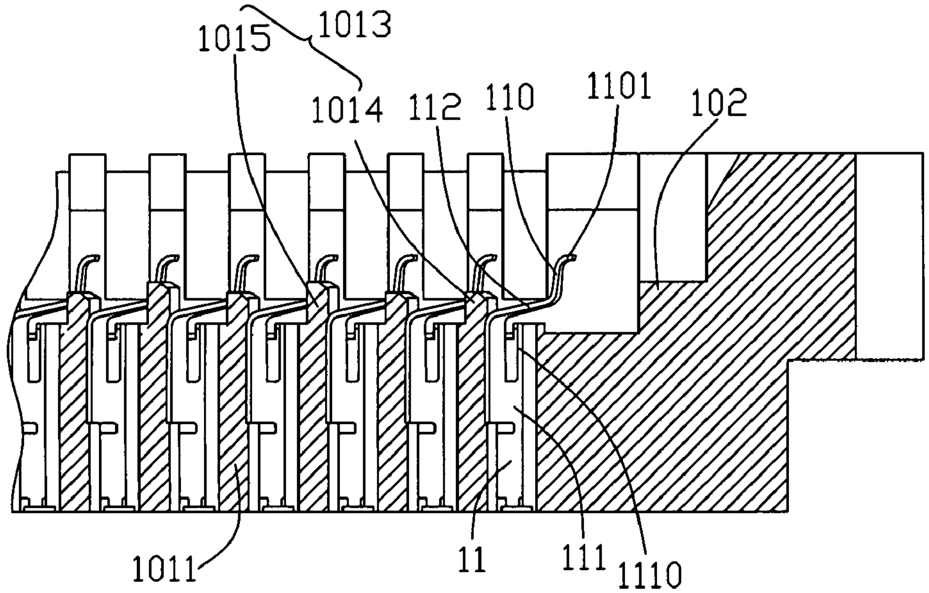
FIG. 7 is an section view of the electrical connector of FIG. 6 take along the line VII-VII.
Figure 8:
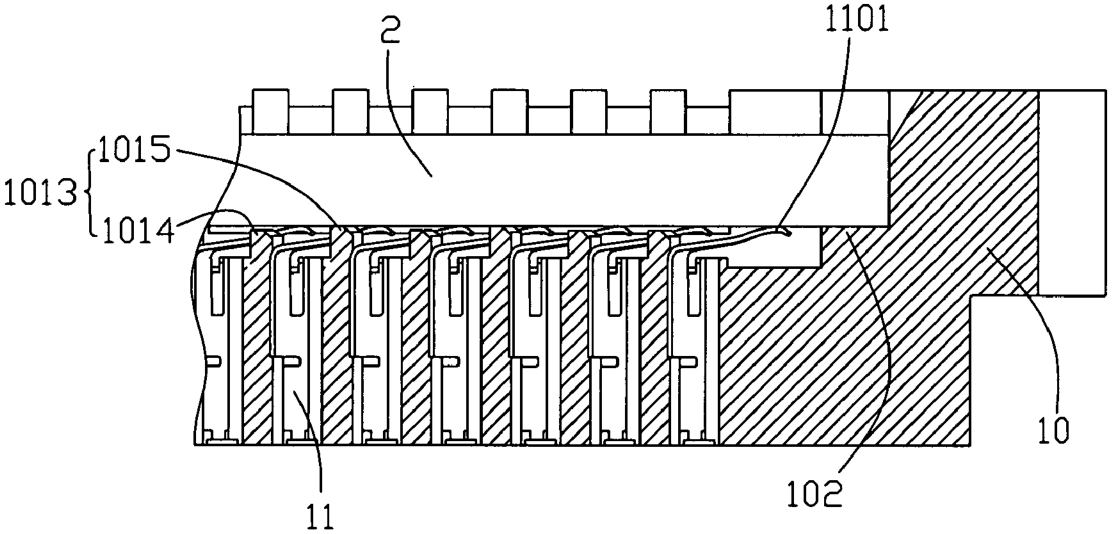
FIG. 8 is an assembly view of the electrical connector, with the IC and the PCB assembled together.

As shown in FIG. 7, the electrical contact 11 stamped from a sheet of resilient metal material comprises a resilient arm 110 having an engaging portion 1101 adapted to contact with the conductive pads 20 of the IC 2, a retaining portion 111 secured in the passageways 1010, which has a vertical portion 1110 for contacting with contact carrier (not shown), and a connecting portion 112 for connecting the retaining portion 111 and the resilient arm 110.

The two opposite second sidewalls 104 each have at least one post 1041 for positioning the IC 2 in the receiving cavity.

In an assembly process, the IC 2 is inserted into the receiving cavity under an external force and seated on the mating surface 101. During insertion of the IC into the receiving cavity, the IC 2 resilient deflect the resilient arm 110 downwardly, and the resilient arm 110 of the electrical contact exerts an normal force on the contact pads 20, thus ensuring proper electrical contact between the engaging portion 1101 of the electrical contact 11 and the conductive pads 20 of the IC 2, When the IC 2 is pressed downwardly by an external force, the second protrusions 1015 and said standoffs 102 being used to prop the IC and reduce or cancel the external force, thus ensuring the IC 2 avoided warpage and proper electrical connection between the engaging portion 1101 of the electrical contact 11 and the conductive pads 20 of the IC 2.

Furthermore, because of the first protrusion 1014 extending upwardly from the clapboard 1011 toward the IC 2, the connecting portion 112 of each electrical contact 11 is arranged between two adjacent first protrusions 1014, which allows the engaging portion 1101, the resilient arm 110 and the connecting portion of two adjacent electrical contacts without interference, while the IC is mated into the receiving cavity of the insulative housing 10 and seated on the mating surface 101 of the insulative housing 10. Thus, proper electrical connection between the engaging portions 1101 of the electrical contacts 11 and the conductive pads 20 of the IC 2 is provided and short-circuited is being avoided.

Furthermore, although the present invention has been described with the preferred embodiment referring to FIGS. 2-8, it is not to be construed as being limited thereto. Various alterations and modifications can be made to embodiment without in any way departing from the scope or spirit of the present invention as defined in appended claims.

What is claimed is:

1. An electrical connector for electrically connecting an IC package having conductive pads and a circuit board, comprising:

an insulative housing defining a mating surface adapted to support an IC package, at least four passageways defined in region within the mating surface and each passageway associated with a clapboard arranged between every two adjacent passageways;

at least four contacts received in corresponding passageways respectively, each contact including a contact engaging portion extending upwardly above the mating surface and toward the IC;

wherein each clapboard has protrusions extending upwardly therefrom along a direction perpendicular to a bottom surface of the IC package seated on the mating surface, the protrusions comprising first protrusions and second protrusions higher than the first protrusions; the first protrusions being arranged between every two adjacent contacts, allowing the engaging portion of the two adjacent contacts without interference when the IC is seated on the mating surface of the housing.

2. The electrical connector as claimed in claim 1, wherein a plurality of standoffs extends from the mating surface, having a same height equal to the second protrusions.

3. The electrical connector as claimed in claim 2, wherein the cross section view of the protrusions is of a triangle shape.

4. The electrical connector as claimed in claim 1, wherein the mating surface defines an opening in the middle thereof.

5. An electrical connector assembly comprising:

an IC package having a number of conductive pads;

an electrical connector defining a mating surface adapted to have the IC package loaded thereon, at least four contacts receiving in at least four passageways disposed in region corresponding to the mating surface, the contact each having an engaging portion extending above the mating surface and toward the IC package; wherein each passageways defines a clapboard ranged between every two adjacent passageways, the clapboard defining a first protrusions and a second protrusions extending therefrom, the second protrusions being used to reduce or cancel an external force, when the conductive pads is closely contacting with the contacts pads under said external force; the first protrusion allowing the engaging portions of two adjacent contacts without interference during the resiliently deform under the external force, when the IC package is seated on the mating surface.

6. The electrical connector as claimed in claim 5, wherein a plurality of standoffs extends from the mating surface, having a same height equal to the second protrusions.

7. The electrical connector as claimed in claim 6, wherein the cross section view of the protrusions is of a triangle shape.

8. An electrical connector assembly comprising:

an insulative housing defining a plurality of passageways extending through an upper surface of the housing;

a plurality of contacts disposed in the passageways, respectively;

a plurality of protrusions formed on the upper surface adjacent to the corresponding passageways, respectively, with a one-to-one positioning relation;

each of said contacts extending along a direction offset from the corresponding protrusion so as not to interfere therewith when the contact is downwardly pressed by an electronic package which is essentially seated on the upper surface of housing; wherein some of said protrusions are lower than the remainder while all of said protrusion constantly efficiently restrictively isolate said contacts from the neighboring ones disregarding whether the contacts are downwardly pressed by the electronic package or not.

9. The electrical connector assembly as claimed in claim 8, wherein the electronic package abut against the contacts and some of the said protrusions but not said remainder.

* * * * *